United States Patent
Shepard (10) Patent No.: US 8,942,020 B2
(45) Date of Patent: Jan. 27, 2015

(54) THREE-LEVEL PHASE LEG FOR A POWER CONVERTER

(75) Inventor: Mark Eugene Shepard, Roanoke, VA (US)

(73) Assignee: General Electric Company, Schenectady, NY (US)

( * ) Notice: Subject to any disclaimer, the term of this patent is extended or adjusted under 35 U.S.C. 154(b) by 271 days.

(21) Appl. No.: 13/531,010

(22) Filed: Jun. 22, 2012

(65) Prior Publication Data

US 2013/0343108 A1    Dec. 26, 2013

(51) Int. Cl.
*H02M 1/00* (2006.01)

(52) U.S. Cl.
USPC .......................................... 363/144

(58) Field of Classification Search
USPC ............ 363/37, 50, 55, 56.01, 132, 136, 137, 363/141, 144; 361/679.01, 679.47, 728, 361/729, 736; 307/82
See application file for complete search history.

(56) References Cited

U.S. PATENT DOCUMENTS

| | | | |
|---|---|---|---|
| 4,151,387 A * | 4/1979 | Peters, Jr. ...................... 219/626 |
| 5,424,579 A | 6/1995 | Arai et al. |
| 5,574,312 A | 11/1996 | Bayerer et al. |
| 6,654,260 B2 * | 11/2003 | Okayama et al. ............... 363/37 |
| 7,327,024 B2 | 2/2008 | Stevanovic et al. |
| 2006/0175630 A1 | 8/2006 | Meier |
| 2011/0260547 A1 | 10/2011 | Wang et al. |
| 2012/0218785 A1* | 8/2012 | Li et al. ...................... 363/21.12 |
| 2014/0111959 A1* | 4/2014 | Li et al. .......................... 361/809 |

FOREIGN PATENT DOCUMENTS

EP    2677847 A2 * 12/2013

* cited by examiner

*Primary Examiner* — Adolf Berhane
(74) *Attorney, Agent, or Firm* — James McGinness, Esq.; Armstrong Teasdale LLP (57) ABSTRACT

A phase leg for a three-level power converter includes a heat sink device that includes a first surface and a second surface opposite the first surface. The phase leg also includes a first portion including at least one semiconductor switching device coupled to the first surface. The phase leg further includes a second portion including at least one semiconductor switching device coupled to the second surface.

19 Claims, 11 Drawing Sheets

THREE-LEVEL PHASE LEG FOR A POWER CONVERTER

BACKGROUND OF THE INVENTION

The subject matter described herein relates generally to power conversion within electric power systems, and more specifically, to low-inductance, three-level, neutral point clamped (NPC) power converters for electric power generation assets.

Generally, a wind turbine includes a rotor that includes a rotatable hub assembly having multiple blades. The blades transform wind energy into a mechanical rotational torque that drives one or more generators via the rotor. At least some of the known wind turbines are physically nested together in a common geographical region to form a wind turbine farm. Variable speed operation of the wind turbine facilitates enhanced capture of energy when compared to a constant speed operation of the wind turbine. However, variable speed operation of the wind turbine produces electric power having varying voltage and/or frequency. More specifically, the frequency of the electric power generated by the variable speed wind turbine is proportional to the speed of rotation of the rotor. A power converter may be coupled between the wind turbine's electric generator and an electric utility grid. The power converter receives electric power from the wind turbine generator and transmits electricity having a fixed voltage and frequency for further transmission to the utility grid via a transformer. The transformer may be coupled to a plurality of power converters associated with the wind turbine farm.

Many known power converters include a plurality of power conversion devices, i.e., power modules that include semiconductor devices such as insulated gate bipolar transistors (IGBTs). The IGBTs, other electronic devices, and the associated electrically conductive connections that form the power modules have known inductances and the associated impedances. The impedances are proportional to the frequencies of the signals transmitted therethrough. As such, transmitting electric current through such power modules at high switching frequencies induces electromagnetic fields that may induce unwanted voltages and currents, thereby increasing switching losses and voltage overshoots. Significantly, some diode devices will experience a reverse recovery that induces a voltage and current spike that is transmitted through briefly-formed commutation loops. The deleterious effects of such commutation loops are proportional to the associated inductance of the loops, and such effects may include high voltage stresses on the semiconductor devices. Moreover, such unwanted voltages and currents may include harmonics affecting the power quality of the electric power transmitted from the power converters. As the switching losses increase and demands for more robust power converters escalate, the size, weight, and cost of the power modules, and, therefore, the power converters, increase proportionally to compensate.

Three-level bridge configurations that generate three voltages, i.e., a positive voltage, a neutral voltage, and a negative voltage, facilitate faster power converter switching speeds, i.e., rates of voltage transitions measured at the output terminals of the converter, than other bridge configurations, thereby facilitating improved power quality. However, configuring such three-level bridges, with the associated heat sinks, as well as the power conversion components and the conductors therebetween, significantly increases the challenges associated with maintaining the inductances of the power modules low enough to reduce the negative impact of higher switching speeds of the power converters. Limiting the switching speeds of the power converters due to the inherent inductances of the modules therein limits the performance advantages associated with the higher switching speeds, and facilitates increased size, weight, and cost of power converters.

BRIEF DESCRIPTION OF THE INVENTION

In one aspect, a phase leg for a three-level power converter is provided. The phase leg includes a heat sink device that includes a first surface and a second surface opposite the first surface. The phase leg also includes a first portion including at least one semiconductor switching device coupled to the first surface. The phase leg further includes a second portion including at least one semiconductor switching device coupled to the second surface.

In another aspect, a phase leg for a three-level power converter is provided. The phase leg includes a plurality of non-neutral planar bus bars, a plurality of semiconductor switching devices coupled to at least one of the non-neutral planar bus bars, and a neutral planar bus bar. The non-neutral planar bus bars, the semiconductor switching devices, and the neutral planar bus bar are configured to define at least one commutation loop within the phase leg. The non-neutral planar bus bars and the neutral planar bus bar are configured and oriented to facilitate flux cancellation in the commutation loop when current flows therethrough, thereby facilitating a reduction of energy stored within loop currents induced therein.

In yet another aspect, a two-layer, direct current (DC) link assembly for a three-level power converter is provided. The DC link assembly includes a first layer including a positive planar bus bar and an adjacent negative planar bus bar separated with a spacing therebetween. The DC link assembly also includes a second layer including a neutral planar bus bar sized to substantially similar dimensions as the first layer. The DC link assembly further includes an insulator positioned between the first layer and the second layer. The insulator is sized to completely extend over the second layer. The DC link assembly also includes at least one phase leg module coupled to the first layer and the second layer.

DETAILED DESCRIPTION OF THE INVENTION

As used herein, the term "blade" is intended to be representative of any device that provides reactive force when in motion relative to a surrounding fluid. As used herein, the term "wind turbine" is intended to be representative of any device that generates rotational energy from wind energy, and more specifically, converts kinetic energy of wind into mechanical energy. As used herein, the term "electric power generation device" is intended to be representative of any device that provides electric power derived from an energy resource. As used herein, the term "wind turbine generator" is intended to be representative of any wind turbine that includes an electric power generation device that generates electrical power from rotational energy generated from wind energy, and more specifically, converts mechanical energy converted from kinetic energy of wind to electrical power.

Technical effects of the apparatus and systems described herein include at least one of: (a) facilitating the use of three-level bridge configurations in power converters while using a two-layer bus structure; (b) decreasing the inductance of commutating loops defined in a three-level bridge configuration, thereby facilitating flux cancellation in the commutation loops when current flows therethrough, thereby facilitating a reduction of energy stored within loop currents induced therein through routine switching actions; (c) increasing the switching speed of power converters for a given IGBT switching frequency as compared to other bridge configurations; (d) increasing the output voltage of power converters as compared to other bridge configurations; (e) improving the power quality by reducing the harmonics for similar switching speeds of power converters as compared to other bridge configurations; (f) increasing heat removal capabilities by "folding" a three-level bridge assembly to use at least two sides of a heat sink for more effective heat removal as compared to bridge circuits without heat sinks or using only one side of a heat sink, thereby facilitating an increase in a power rating of the bridge circuit; (g) increasing power ratings of power converters without equivalent increases in size and weight; (h) separating the positive and negative terminals of a three-level bridge configuration such that heat-generating power conversion devices may be positioned on opposite sides of a heat sink device; and (i) facilitating low inductance interconnections of portions of a three-level phase leg positioned on opposite sides of a heat sink.

The apparatus and systems described herein facilitate transmitting electric power from renewable and non-renewable electric power generation assets. Also, the apparatus and systems described herein facilitate transmitting electric power to electric motor drive devices. Specifically, the apparatus and systems described herein facilitate generating and transmitting increased electric power using power converters with a smaller physical footprint. More specifically, the apparatus and systems described herein facilitate using single IGBTs and diodes in a low-inductance, three-level bridge, neutral point clamped (NPC) configuration in power converters, thereby facilitating an increase in the switching speeds and the power ratings of the power converters without similarly increasing the size of the power converters.

Although generally described herein with respect to a wind turbine facility, the systems described herein are applicable to any type of electric systems including, for example, and without limitation, renewable energy sources such as solar power generation systems, fuel cells, geothermal generators, hydro-power generators, non-renewable energy sources such as fossil and nuclear power plants, and motor drive devices.

Figure 1:
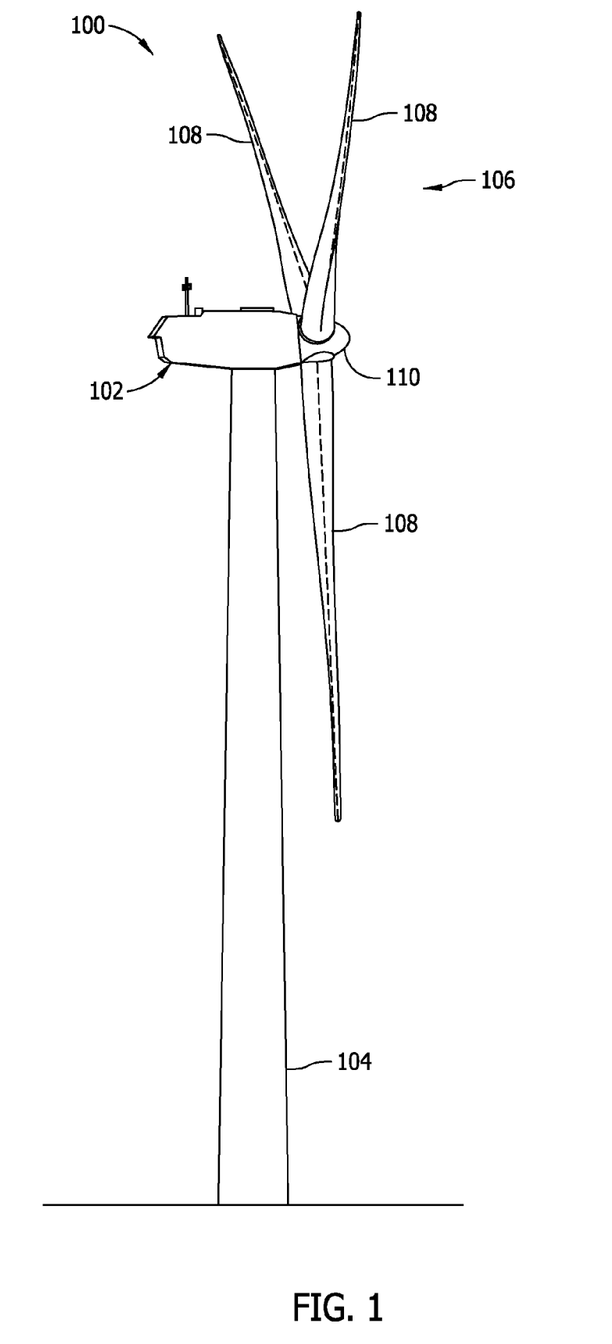
FIG. 1 is a schematic view of an exemplary wind turbine.

FIG. 1 is a schematic view of an exemplary wind turbine generator 100. Wind turbine generator 100 is an electric power generation device including a nacelle 102 housing a generator (not shown in FIG. 1). Nacelle 102 is mounted on a tower 104 (a portion of tower 104 being shown in FIG. 1). Tower 104 may be any height that facilitates operation of wind turbine generator 100 as described herein. Wind turbine generator 100 also includes a rotor 106 that includes three rotor blades 108 attached to a rotating hub 110. Alternatively, wind turbine generator 100 includes any number of blades 108 that facilitates operation of wind turbine generator 100 as described herein. In the exemplary embodiment, wind turbine generator 100 includes a gearbox (not shown in FIG. 1) rotatably coupled to rotor 106 and a generator (not shown in FIG. 1). While only one wind turbine generator 100 is shown, a plurality of wind turbine generators 100 may be at least partially grouped geographically and/or electrically to define a renewable energy generation facility, i.e., a wind turbine farm (not shown in FIG. 1). Such a wind turbine farm may be defined by a number of wind turbine generators 100 in a particular geographic area, or alternatively, defined by the electrical connectivity of each wind turbine generator 100 to a common substation.

Figure 2:
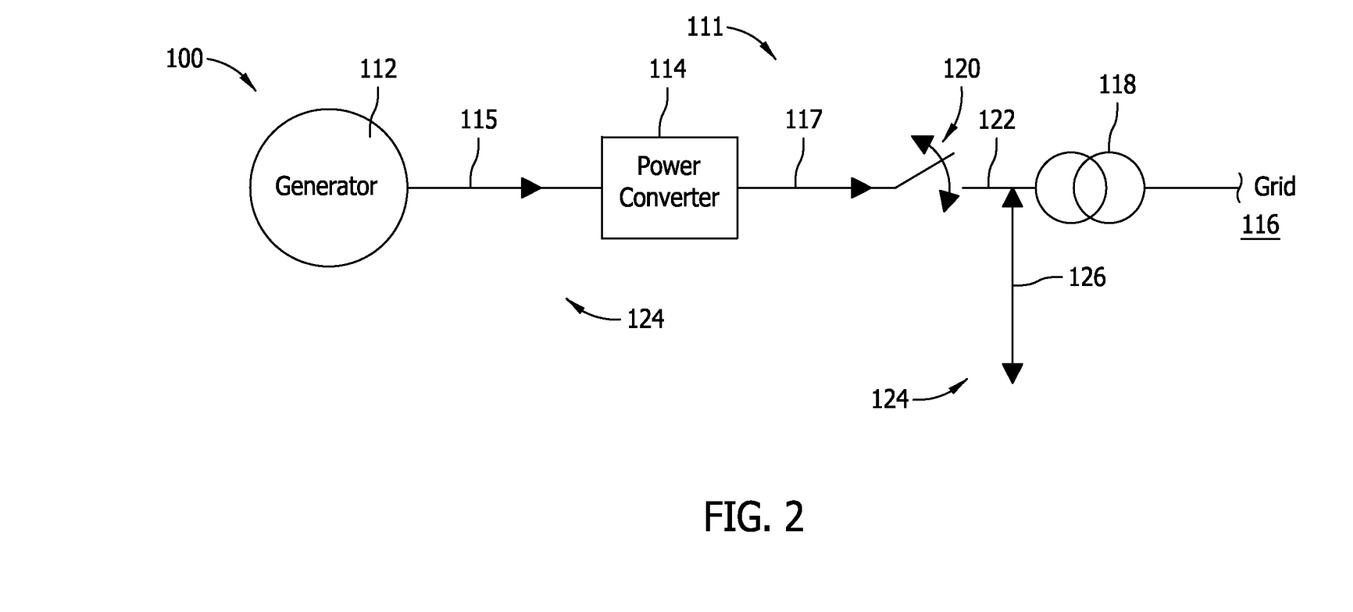
FIG. 2 is a schematic view of an exemplary power conversion and transmission system that may be used with the wind turbine shown in FIG. 1.

FIG. 2 is a schematic view of an exemplary power conversion and transmission system 111 that may be used with wind turbine generator 100. Wind turbine generator 100 is a renewable energy source that includes an electric power generator 112 coupled to a first power source, i.e., a power converter 114, through a plurality of input conduits 115 (only one shown in FIG. 2). Electric power generator 112 is any type of generator that enables operation of wind turbine generator 100 as described herein, including, without limitation, a synchronous permanent magnet generator (PMG), an electrically excited synchronous generator (EESG), and a doubly-fed induction generator (DFIG).

Power converter 114 is any device that enables operation of wind turbine generator 100 as described herein, including, without limitation, a full power conversion assembly. In the exemplary embodiment, electrical, three-phase, sinusoidal, AC power is generated within electric power generator 112 and is transmitted to power converter 114 through input conduits 115. Within power converter 114, the electrical power is rectified in a converter portion (not shown in FIG. 2) from sinusoidal, three-phase AC power to direct current (DC) power. The DC power is transmitted to an inverter (not shown in FIG. 2) that converts the DC electrical power to three-phase, sinusoidal AC electrical power with regulated voltages, currents, and frequencies. Power converter 114 compensates or adjusts the frequency of the three-phase power from electric power generator 112 for changes, for example, in the wind speed at hub 110 and blades 108 (both shown in FIG. 1). Therefore, in this manner, mechanical and electrical rotor frequencies are decoupled from grid frequency.

Power converter 114 is coupled to an electric power grid 116 via a plurality of output conduits 117 (only one shown in FIG. 2), a main transformer 118, a main transformer circuit breaker 120, and a main transformer bus 122. When circuit breaker 120 is closed, three-phase AC electric power is transmitted from power converter 114 to electric power grid 116 for further transmission and distribution.

While only one wind turbine generator 100 is shown, a plurality of wind turbine generators 100 may be at least partially grouped geographically and/or electrically to define a renewable energy generation facility, i.e., a wind turbine farm 124. Each wind turbine generator 100 is coupled to main transformer bus 122 through a substation bus 126. Such wind turbine farm 124 may be defined by a number of wind turbine generators 100 in a particular geographic area, or alternatively, defined by the electrical connectivity of each wind turbine generator 100 to a common substation.

In some alternative embodiments, a combination of electric power generation devices are used in conjunction with, or in place of, wind turbine generator 100. In at least one alternative embodiment, wind turbine generator 100 is replaced with solar panels (not shown) coupled to form one or more solar arrays (not shown) to facilitate operating at a desired power output with supplemental, solar-generated power. Solar panels include, in one alternative embodiment, one or more of a photovoltaic panel, a solar thermal collector, or any other device that converts solar energy to electrical energy. In such alternative embodiments, each solar panel is a photovoltaic panel that generates a substantially direct current power as a result of solar energy striking solar panels.

Also, in such alternative embodiments, each solar array is coupled to a power converter that is similar to at least a portion of power converter 114 that converts the DC power to AC power that is transmitted to a transformer similar to transformer 118 and then to grid 116. Furthermore, although generally described herein with respect to wind turbine generator 100 and a solar array facility, the systems described herein are applicable to any type of electric generation system including, for example, fuel cells, geothermal generators, hydropower generators, and/or other devices that generate power from renewable and/or non-renewable energy sources.

Figure 3:
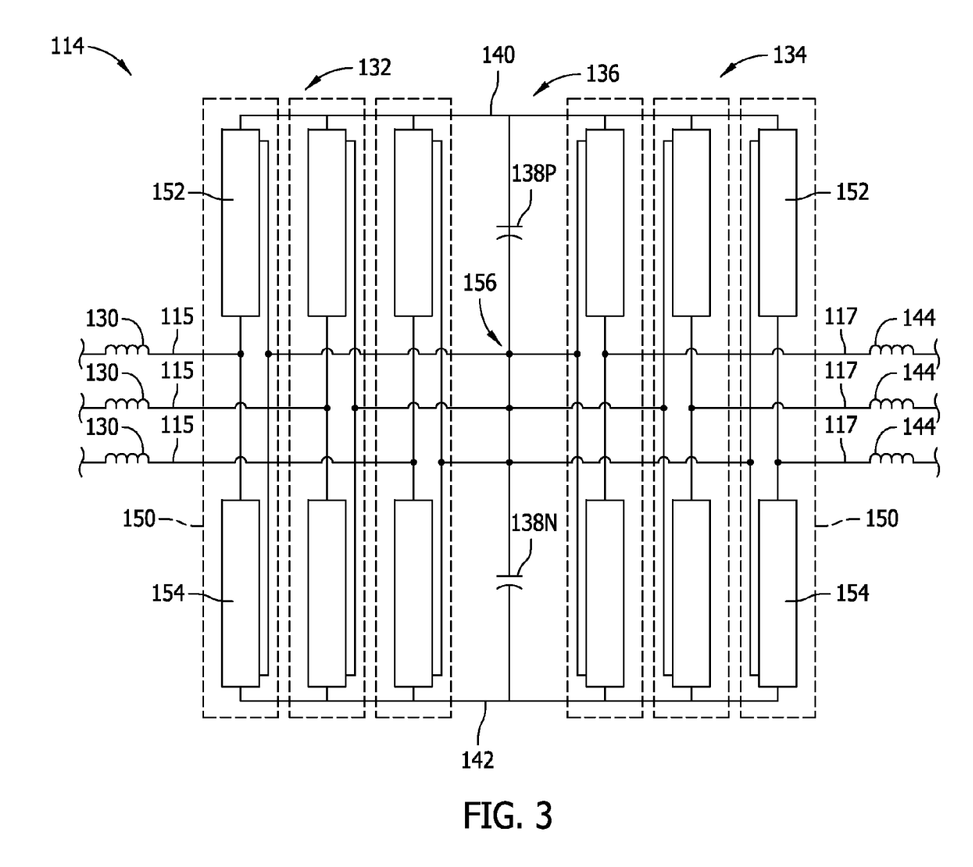
FIG. 3 is a schematic overhead view of an exemplary power converter that may be used with the system shown in FIG. 2.

FIG. 3 is a schematic overhead view of power converter 114 that may be used with power conversion and transmission system 111 (shown in FIG. 2). Each of three input conduits 115 is configured such that the input current is split between each conduit 115. At least one boost inductor 130 is coupled to each of input conduits 115. Boost inductors 130 facilitate filtering the input voltage and/or current received from generator 112 (shown in FIG. 2). In addition, at least a portion of the energy received from generator 112 is temporarily stored within each boost inductor 130.

In the exemplary embodiment, power converter 114 includes an AC-to-DC converter portion 132 and a DC-to-AC inverter portion 134 coupled together by a DC bus system 136. Therefore, power converter 114 is a full power converter. Alternatively, for those embodiments that include electric power generation devices such as, without limitation, solar arrays, that generate a DC voltage, converter portion 132 may be replaced with, or supplemented with, a DC-to-DC boost converter. Moreover, in the exemplary embodiment, DC bus system 136 includes capacitors 138, i.e., capacitors 138P and 138N. Alternatively, DC bus system 136 includes any number of capacitors 138 and/or any other electrical power storage devices that enable power converter 114 to function as described herein. DC bus system 136 also includes a positive rail 140 and a negative rail 142. At least one filtering inductor 144 is coupled to each of output conduits 117. Inductors 144 facilitate filtering the output voltage and/or current transmitted from inverter portion 134.

In operation, converter portion 132 is coupled to, and receives AC power from, generator 112 through input conduits 115. Converter portion 132 rectifies the AC power to a predetermined DC voltage. As power is transmitted through converter portion 132, a DC voltage is induced across DC bus system 136 and energy is stored within capacitors 138. Inverter portion 134 converts DC power transmitted from DC bus system 136 into AC power for transmission to electric power grid 116 (shown in FIG. 2) through output conduits 117.

In the exemplary embodiment, both converter portion 132 and inverter portion 134 include a plurality of phase legs 150, i.e., one phase leg 150 for each of the three phases transmitted from generator 112 and transmitted to grid 116. Each of legs 150 includes an upper portion 152 and a lower portion 154 coupled together in serial arrangement for each phase of electrical power that power converter 114 generates. For each phase leg 150 in converter portion 132, upper portion 152 extends between positive rail 140 and input conduit 115 and lower portion 154 extends between negative rail 142 and input conduit 115. Also, for each phase leg 150 in inverter portion 134, upper portion 152 extends between positive rail 140 and output conduit 117 and lower portion 154 extends between negative rail 142 and output conduit 117. Each of legs 150 include a neutral bus connection 156 coupled to each of upper portion 152 and lower portion 154, thereby defining power converter 114 as a three-level converter that facilitates a bridge configuration that generates three voltages, i.e., a positive voltage, a neutral voltage, and a negative voltage.

Figure 4:
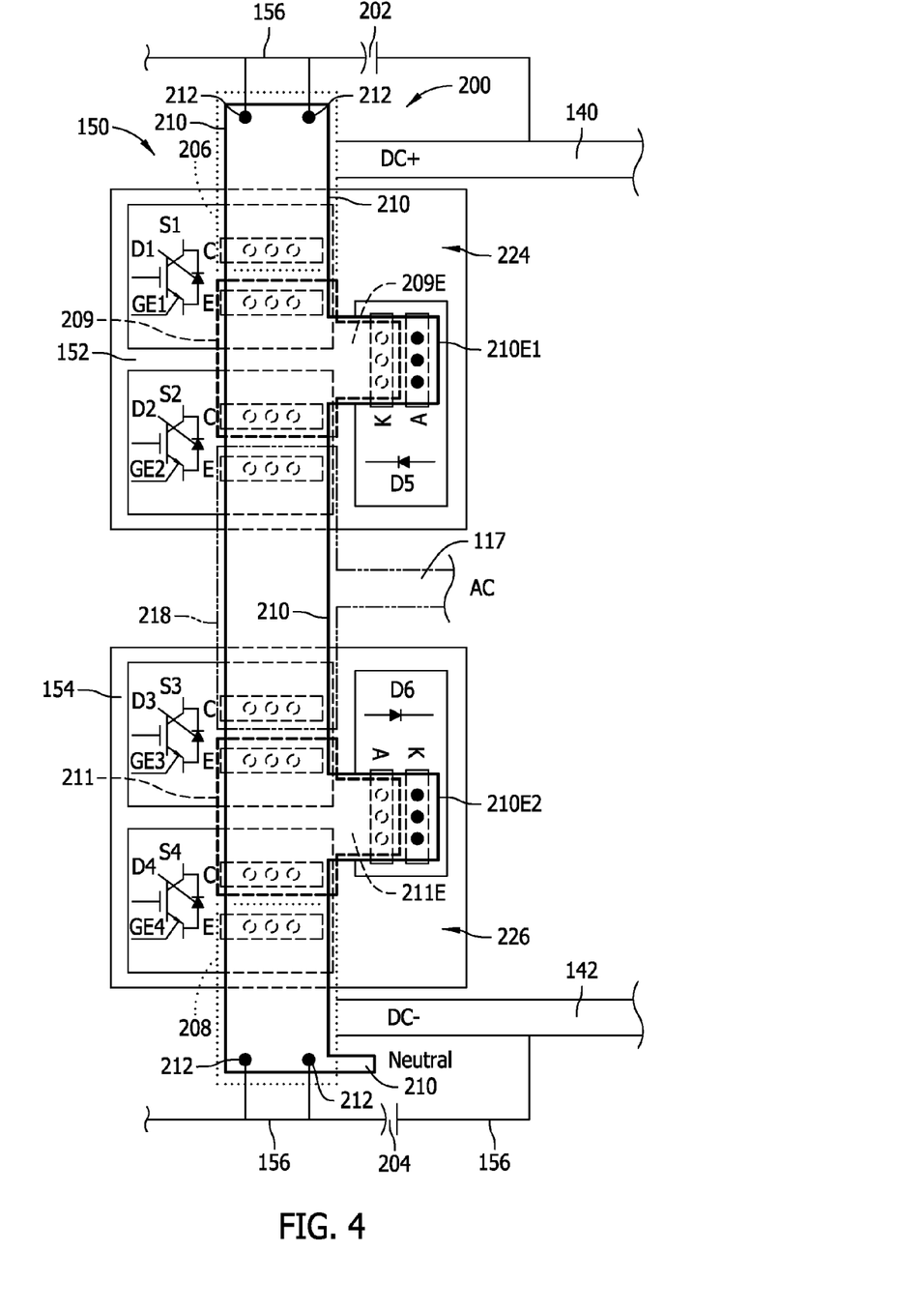
FIG. 4 is a schematic view of an exemplary three-level phase leg circuit that may be used with the power converter shown in FIG. 3.

FIG. 4 is a schematic view of an exemplary three-level phase leg circuit 200 of one phase leg 150 of inverter portion 134 (shown in FIG. 3) of power converter 114 (shown in FIG. 3). All six phase legs 150 are substantially identical with the principle exception that three of the six phase legs 150 are coupled to input conduits 115 (shown in FIG. 3) and the other three phase legs 150 are coupled to output conduits 117. Otherwise, each phase leg 150 of converter portion 132 (shown in FIG. 3) and inverter portion 134 are substantially similar and each includes upper and lower portions 152 and 154, respectively, coupled in series. Three-level phase leg circuit 200 is coupled to an upper capacitor 202 and a lower capacitor 204, wherein capacitors 202 and 204 are a portion of a larger DC link assembly (not shown in FIG. 4 and described further below) external to portions 152 and 154. Three-level phase leg circuit 200 also includes a positive bus 206 coupled to upper capacitor 202, a negative bus 208 coupled to lower capacitor 204, and a midpoint, or neutral bus 210 also coupled to capacitors 202 and 204. Neutral bus 210 is coupled to neutral bus connection 156 through at least one neutral terminal 212 (two shown in FIG. 4). Also, neutral bus 210 extends proximate to portions 152 and 154 and extends over positive bus 206 and negative bus 208 with a dielectric material (not shown in FIG. 4) therebetween.

In the exemplary embodiment, upper portion 152 includes two semiconductor switching devices, i.e., outer switching device S1 and inner switching device S2. Switching devices S1 and S2 are coupled in series through a first switch interconnect bus 209 that includes an extension 209E. In the exemplary embodiment, switching devices S1 and S2 are insulated gate bipolar transistors (IGBTs). Alternatively, switching devices S1 and S2 are any other suitable transistor or any other suitable switching device, including, without limitation, gate turn-off thyristors (GTOs). Antiparallel, i.e., inverse diodes D1 and D2 are coupled in parallel with switching devices S1 and S2, respectively.

Also, in the exemplary embodiment, upper portion 152 includes a clamping diode D5 coupled to neutral bus 210 through at least one, e.g., three, anode terminals A and a neutral bus extension 210E1. Alternatively, clamping diode D5 is coupled to neutral bus 210 through any number of anode terminals A that enables operation of three-level phase leg circuit 200 as described herein. Clamping diode D5 is also coupled to the output of switching device S1 and the input of switching device S2 through a at least one, e.g., three, cathode terminals K coupled to first switch interconnect bus 209 through first switch interconnect bus 209E. Alternatively, clamping diode D5 is coupled to first switch interconnect bus 209 through any number of cathode terminals K that enables operation of three-level phase leg circuit 200 as described herein. The input of switching device S1 is coupled to positive bus 206 and the output of device S1 is coupled to clamping diode D5 and the input to switching device S2 through first switch interconnect bus 209. The output of switching device S2 is coupled to output conduit 117 and an output conduit connection portion 218 (described further below).

Further, in the exemplary embodiment, lower portion 154 includes an inner switching device S3 and outer switching device S4. Switching devices S3 and S4 are coupled in series through a second switch interconnect bus 211, that includes an extension 211E, and are substantially similar to devices S1 and S2. Antiparallel, i.e., inverse diodes D3 and D4 are coupled in parallel with switching devices S3 and S4, respectively.

Moreover, in the exemplary embodiment, lower portion 154 includes a clamping diode D6 coupled to neutral bus 210 through at least one, e.g., three, cathode terminals K and a neutral bus extension 210E2. Alternatively, clamping diode D6 is coupled to neutral bus 210 through any number of cathode terminals K that enables operation of three-level phase leg circuit 200 as described herein. Clamping diode D6 is also coupled to the output of switching device S3 and the input of switching device S4 through at least one, e.g., three, anode terminals A coupled to second switch interconnect bus 211 through second switch interconnect bus 211E. Alternatively, clamping diode D6 is coupled to second switch interconnect bus 211 through any number of anode terminals A that enables operation of three-level phase leg circuit 200 as described herein. Clamping diode D6 is similar to clamping diode D5, with the exception that diode D6 is reversed with respect to diode D5. The input of switching device S3 is coupled to output conduit 117 and output conduit connection portion 218 (described further below), and the output of device S3 is coupled to clamping diode D6 and the input to switching device S4. The output of switching device S4 is coupled to negative bus 208.

Also, in the exemplary embodiment, each of switching devices S1, S2, S3, and S4 includes a plurality of control connections. Specifically, each switching device S1, S2, S3, and S4 includes gate and emitter control connections GE1, GE2, GE3, and GE4, respectively. Gate and emitter control connections GE1, GE2, GE3, and GE4 are each coupled to an individual drive circuit (not shown) that controls the switching action of associated switching devices S1, S2, S3, and S4, respectively. Alternatively, any control configuration that enables operation of three-level phase leg circuit 200 and power converter 114 as described herein is used.

Moreover, in the exemplary embodiment, each of switching devices S1, S2, S3, and S4 includes a plurality, e.g., three, of collector (C) terminals and a plurality of emitter (E) terminals. Alternatively, any number of C terminals and E terminals are used that enable operation of three-level phase leg circuit 200 as described herein. Therefore, for an illustrative example, clamping diode D5 is coupled to S2E, S3C, and neutral bus 210. Similarly, clamping diode D6 is coupled to S3E, S4C and neutral bus 210.

In addition to those components described and shown on three-level phase leg circuit 200, additional components may be added to increase the flexibility of operation and application of circuit 200. For example, without limitation, additional components may include IGBTs, resistors, and thermistors in parallel to switches S1 through S4.

Moreover, in the exemplary embodiment, switching devices S2 and S3 are coupled to each other and output conduit 117 through an output conduit connection portion 218. Positive bus 206, negative bus 208, neutral bus 210, first switch interconnect bus 209, second switch interconnect bus 211, and output conduit connection portion 218 are formed and oriented as low inductance planar bus bars that facilitate a low interconnect inductance within three-level phase leg circuit 200. Also, the portion of neutral bus 210 extending between terminals D5A and D6K that is positioned proximate to a current path defined by terminals DSK, S2C, S2E, S3C, S3E, and D6A at least partially defines a commutation path (discussed further below).

Figure 5:
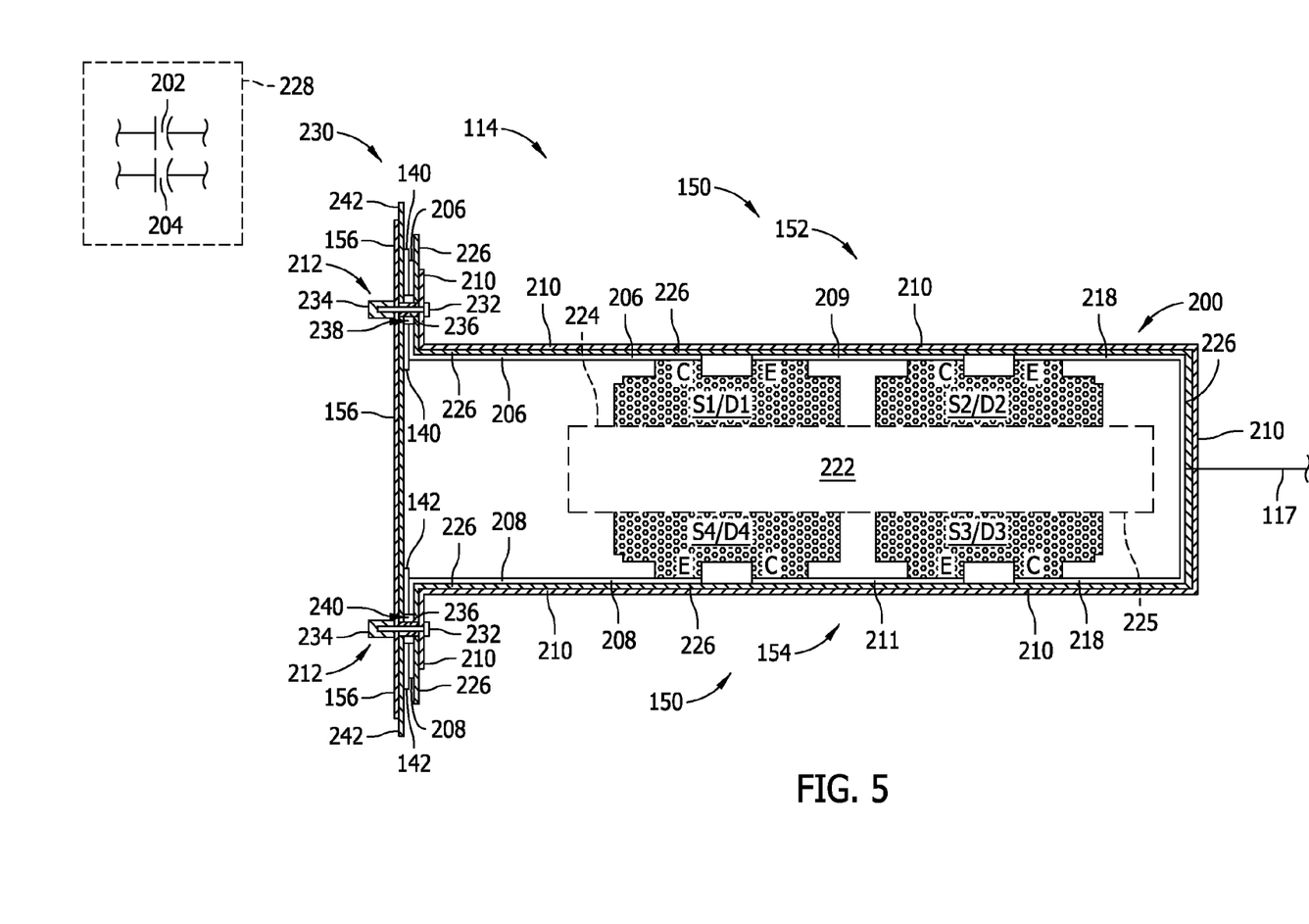
FIG. 5 is a schematic side view of the three-level phase leg circuit shown in FIG. 4 with a neutral connection coupled thereto.

FIG. 5 is a schematic side view of three-level phase leg circuit 200 with neutral bus connection 156 coupled thereto. FIG. 5 is based on the portion of FIG. 9 taken along line 5-5 (shown in FIG. 9). Three-level phase leg circuit 200 and neutral bus connection 156 are portions of a two layer, DC link assembly (not shown in FIG. 5 and described further below.) In the exemplary embodiment, each phase leg 150 includes a heat sink device 222 that includes a first surface 224 and an opposing second surface 225. Components of first portion 152 of phase leg 150 are coupled to first surface 224. Specifically, semiconductor switching devices S1 and S2, inverse diodes D1 and D2, and clamping diode D5 (shown in FIG. 4) are coupled to first surface 224. Similarly, components of second portion 154 of phase leg 150 are coupled to second surface 225. Specifically, semiconductor switching devices S3 and S4, inverse diodes D3 and D4, and clamping diode D6 (shown in FIG. 4) are coupled to second surface 225.

Therefore, in the exemplary embodiment, three-level phase leg circuit 200 is "folded over", i.e., wrapped around heat sink device 222. Each phase leg 150 is configured with components of first portion 152 and second portion 154 coupled to heat sink device 222 and positioned on opposing surfaces 224 and 225, respectively, of heat sink device 222. Heat transfer is removed from heat sink device 222 through any heat transfer means that enables operation of three-level phase leg circuit 200 and power converter 114 as described herein, including, without limitation, fluid-cooling, e.g., refrigerant-cooling, water-cooling, and air-cooling.

Also, in the exemplary embodiment, a non-conducting, electrically-insulating material 226 is positioned between neutral bus 210 and each of busses 206, 208, 209, 211, and 218 to decrease the potential for a short circuit between them.

Further, in the exemplary embodiment, positive bus 206, negative bus 208, first switch interconnect bus 209, second switch interconnect bus 211, output conduit connection portion 218, and portions of neutral bus 210 are formed and oriented to define a low inductance planar bus bar configuration that facilitates a low interconnect inductance within three-level phase leg circuit 200. Neutral bus 210 is formed and oriented to be substantially parallel to busses 206, 208, 209, 211, and 218 to facilitate such low interconnect inductance. Also, neutral bus 210 is positioned with a spacing between bus 210 and busses 206, 208, 209, 211, and 218 sized to further facilitate a low interconnect inductance within three-level phase leg circuit 200. Further, each of busses 206, 208, 209, 210, 211, and 218 are sized with a predetermined width and insulator 226 is sized with a predetermined thickness such that a thickness value of insulator 226 is small as compared to a width value of busses 206, 208, 209, 210, 211, and 218. For example, and without limitation, a bus width-to-insulator thickness ratio is approximately 10:1.

Moreover, in the exemplary embodiment, upper capacitor 202 and lower capacitor 204 are positioned within a capacitor bank 228. Any number of capacitors may be positioned in capacitor bank 228, including, without limitation, the capacitors (not shown) for the remaining phase legs 150 (shown in FIG. 3). Also, upper capacitor 202 is coupled directly to positive rail 140 and neutral bus connection 156 (coupling not shown in FIG. 5 for clarity) using any method that enables operation of three-level phase leg circuit 200 and power converter 114 as described herein. Similarly, lower capacitor 204 is coupled directly to negative rail 142 and neutral bus connection 156 (coupling not shown in FIG. 5 for clarity) using any method that enables operation of three-level phase leg circuit 200 and power converter 114 as described herein. Upper capacitor 202 and lower capacitor 204 are configured to serve all six phase legs 150 within a larger DC link assembly (not shown in FIG. 5 and discussed further below).

Also, in the exemplary embodiment, three-level phase leg circuit 200 is coupled to neutral bus connection 156 through a neutral bus coupling apparatus 230. Neutral bus coupling apparatus 230 includes neutral bus terminals 212 that include a fastener 232, a receptacle 234, and a conductive bushing 236 deposited within a void 238 defined within positive rail 140 and positive bus 206 and a void 240 defined within negative rail 142 and negative bus 208. Fastener 232 extends through and contacts neutral bus 210 and neutral bus connection 156 to induce a contact force between neutral bus 210 and conductive bushing 236 and inducing a contact force between conductive bushing 236 and neutral bus connection 156 such that neutral bus 210 is maintained at substantially the same potential as connection 156. Neutral bus coupling apparatus 230 also includes an insulator 242 between positive rail 140 and neutral bus connection 156 and negative rail 142 and neutral bus connection 156.

Further, in the exemplary embodiment, neutral bus coupling apparatus 230 facilitates coupling neutral bus connection 156 to neutral bus 210 and forming and orienting neutral bus 210 as low inductance planar bus bars substantially parallel to busses 206, 208, 209, and 211 to facilitate a low interconnect inductance.

Figure 6:
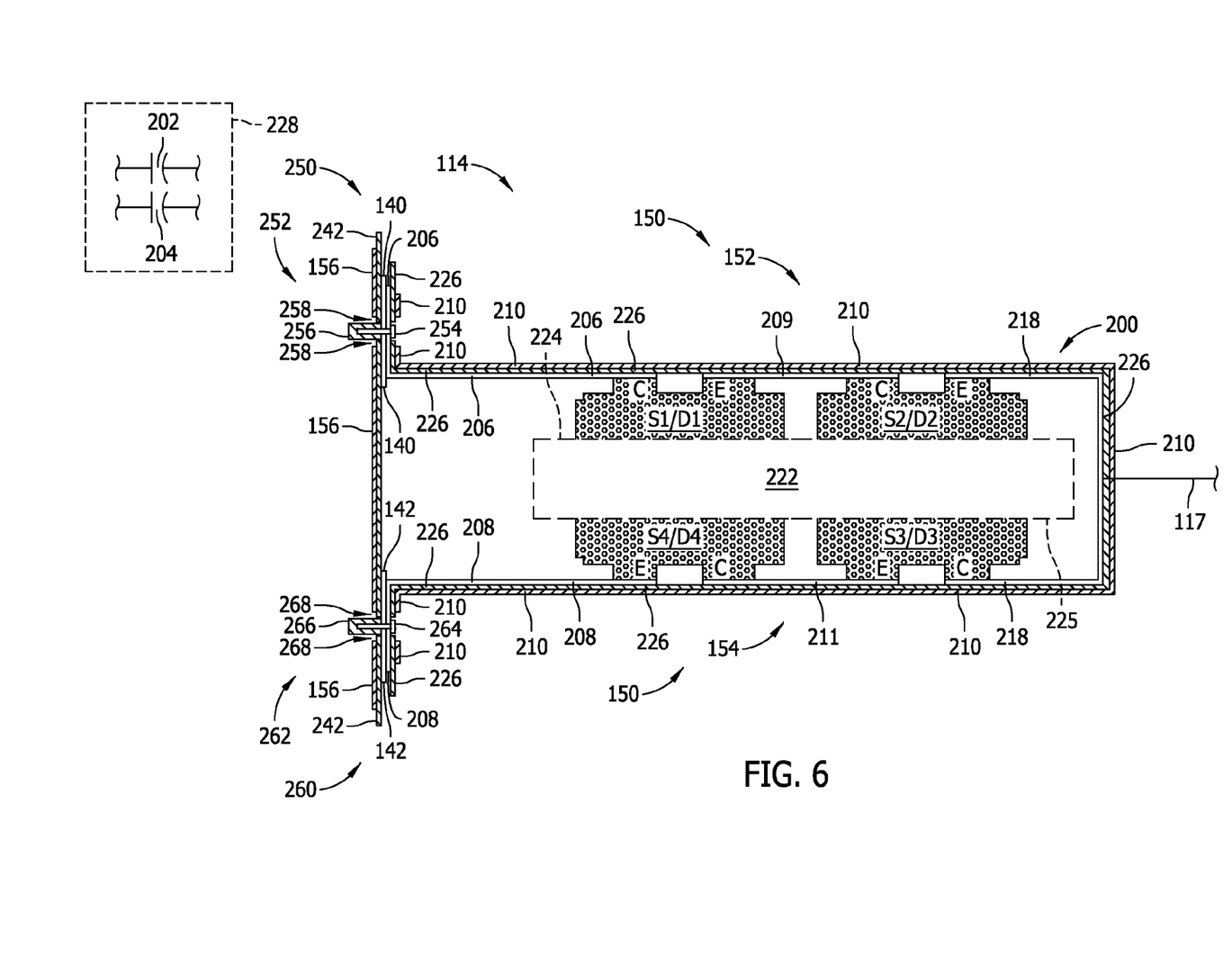
FIG. 6 is a schematic side view of the three-level phase leg circuit shown in FIG. 4 with a positive connection and a negative connection coupled thereto.

FIG. 6 is a schematic side view of three-level phase leg circuit 200 with a positive bus coupling apparatus 250 and a negative bus coupling apparatus 260 coupled thereto. FIG. 6 is based on the portion of FIG. 9 taken along line 6-6 (shown in FIG. 9). Three-level phase leg circuit 200, positive bus coupling apparatus 250, and a negative bus coupling apparatus 260 are portions of a two layer, DC link assembly (not shown in FIG. 6 and described further below.) In the exemplary embodiment, three-level phase leg circuit 200 is coupled to positive bus coupling apparatus 250 through a positive bus terminal 252. Positive bus terminal 252 includes a fastener 254 inserted into a receptacle 256. A void 258 is formed within neutral bus connection 156 to accept receptacle 256. Fastener 254 extends through and contacts positive rail 140 and positive bus 206 to induce a contact force between positive rail 140 and positive bus 206 such that positive bus 206 is maintained at substantially the same potential as positive rail 140. Positive bus coupling apparatus 250 also includes insulator 242 between positive rail 140 and neutral bus connection 156.

Also, in the exemplary embodiment, three-level phase leg circuit 200 is coupled to negative bus coupling apparatus 260 through a negative bus terminal 262. Negative bus terminal 262 includes a fastener 264 inserted into a receptacle 266. A void 268 is formed within neutral bus connection 156 to accept receptacle 266. Fastener 264 extends through and contacts negative rail 142 and negative bus 208 inducing a contact force between negative rail 142 and negative bus 208 such that negative bus 208 is maintained at substantially the same potential as negative rail 142. Negative bus coupling apparatus 260 also includes insulator 242 between negative rail 142 and neutral bus connection 156.

Further, in the exemplary embodiment, positive bus coupling apparatus 250 facilitates coupling positive rail 140 and positive bus 206 and forming and orienting positive bus 206 substantially parallel to bus 210 to define a low inductance planar bus bar configuration to facilitate a low interconnect inductance. Moreover, negative bus coupling apparatus 260 facilitates coupling negative rail 142 and negative bus 208 and forming and orienting negative bus 208 substantially parallel to bus 210 to define a low inductance planar bus bar configuration to facilitate a low interconnect inductance. Also, positioning positive bus coupling apparatus 250 separate and opposite to, but close to negative bus coupling apparatus 260 facilitates positioning upper portion 152 on first surface 224 of heat sink device 222 and positioning lower portion 154 on second surface 225 of heat sink device 222. Furthermore, positioning positive bus coupling apparatus 250 separate and opposite to, but close to negative bus coupling apparatus 260 with sufficient separation therebetween facilitates use of three-level phase leg circuit 200 in space-constrained applications. Also, positioning positive bus coupling apparatus 250 and negative bus coupling apparatus 260 in the vicinity of neutral bus coupling apparatus 230 (shown in FIG. 5) with sufficient separation therebetween facilitates use of three-level phase leg circuit 200 in space-constrained applications.

Figure 7:
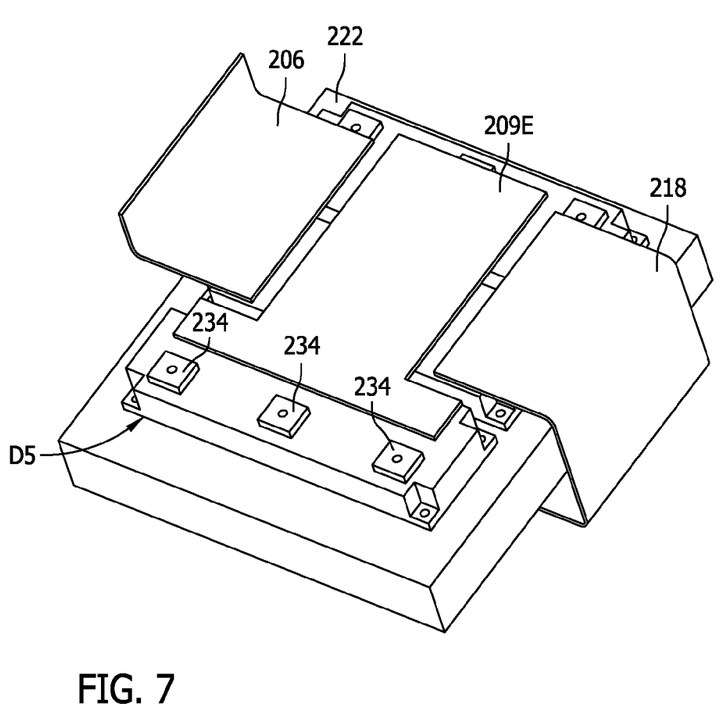
FIG. 7 is a schematic perspective view of a portion of the three-level phase leg circuit shown in FIG. 4.
Figure 8:
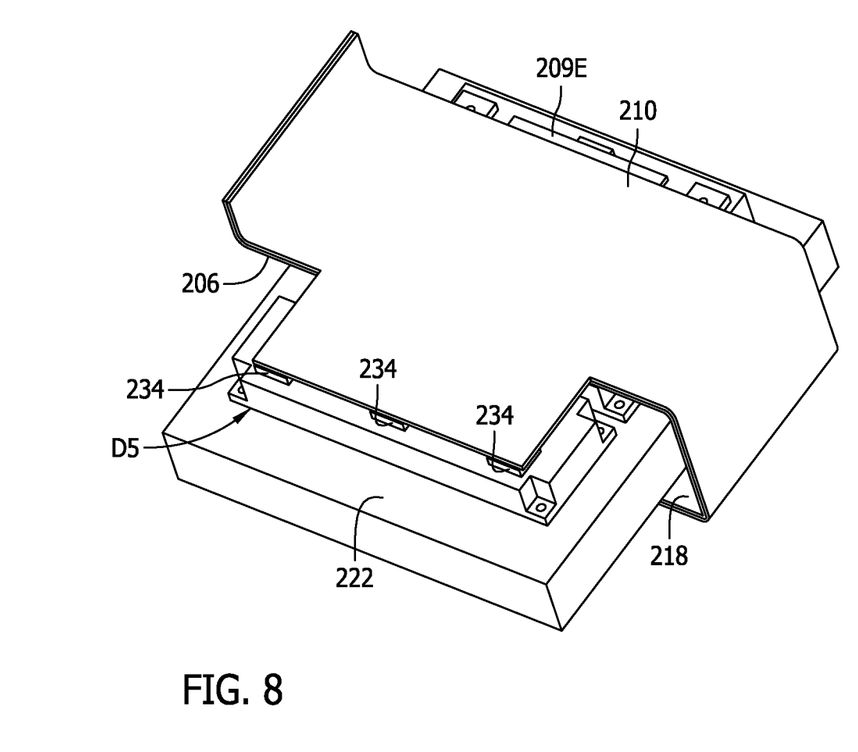
FIG. 8 is a schematic perspective view of the portion of the three-level phase leg circuit shown in FIG. 7.

FIG. 7 is a schematic perspective view of a portion, i.e., clamping diode D5, of three-level phase leg circuit 200 with neutral bus 210 (both shown in FIGS. 4, 5, and 6) removed for clarity. FIG. 8 is a schematic perspective view of the portion, i.e., clamping diode D5, of three-level phase leg circuit 200, with neutral bus 210 installed. Clamping diode D6 (shown in FIG. 4) is substantially similar to clamping diode D5.

In the exemplary embodiment, clamping diode D5 is positioned on, and coupled to, heat sink device 222. Moreover, clamping diode D5 is coupled to first switch interconnect bus extension 209E. Clamping diode D5 includes three neutral bus coupling contacts 234. Neutral bus 210 (only shown in FIG. 8) is configured to couple to neutral bus coupling contacts 234 of clamping diode D5 and to extend over positive bus 206, first switch interconnect bus extension 209E, and output conduit connection portion 218. Insulator 226 (shown in FIG. 5) is positioned between neutral bus 210 and busses 206, 209E, and 218.

Figure 9:
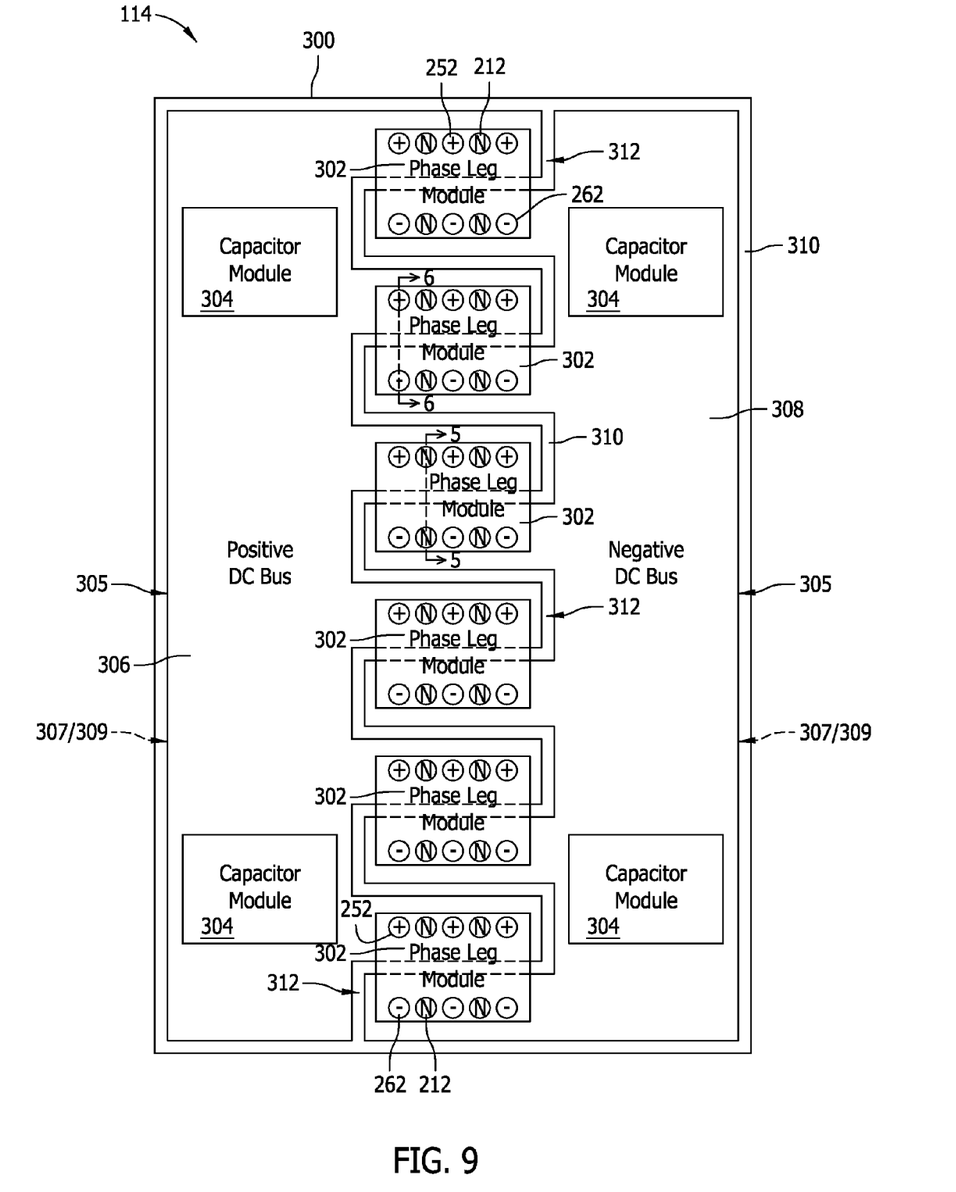
FIG. 9 is a frontal view of an exemplary two-layer, direct current (DC) link assembly that can be used with the three-level power converter shown in FIG. 3.

FIG. 9 is a frontal view of an exemplary two-layer, DC link assembly 300 that is used with three-level power converter 114. As used herein, the term "two-layer" refers to two electrical bus layers and does not refer to an insulating layer therebetween. Power converter 114 includes any number of DC link assemblies 300 that enable operation of power converter 114 as described herein. In the exemplary embodiment, DC link assembly 300 includes six phase leg modules 302. Each module 302 includes a phase leg 150 (shown in FIGS. 3, 4, 5, and 6) with a phase leg circuit 200 (shown in FIGS. 4, 5, and 6). Each module 302 also includes any number of positive terminals 252, negative terminals 262, and neutral terminals 212 that enables operation of power converter 114 as described herein. As described above, FIG. 5 is based on the portion of FIG. 9 taken along line 5-5 and FIG. 6 is based on the portion of FIG. 9 taken along line 6-6.

Also, in the exemplary embodiment, DC link assembly 300 includes four capacitor modules 304 that each include any number of upper capacitors 202 and lower capacitors 204 (both shown in FIGS. 4, 5, and 6) that enables operation of power converter 114 as described herein. Upper capacitors 202 are in separate capacitor modules 304 from lower capacitors 204.

Further, in the exemplary embodiment, DC link assembly 300 includes a first layer 305 that includes a planar positive DC bus bar 306 and an opposing planar negative DC bus bar 308. DC link assembly 300 also includes a second layer 307 that includes a planar neutral bus bar 309. Bus bars 306 and 308 are positioned on top of planar neutral bus bar 309 with an insulator 310 therebetween. Second layer 307 has substantially the same height and length dimensions as first layer 305. Insulator 310 has height and length dimensions just slightly greater than that of the first layer 305 and second layer 307. As used herein, the term "two-layer" refers to two electrical bus layers. i.e., first layer 305 and second layer 307, and does not refer to insulator 310 therebetween.

Positive terminals 252 are coupled to positive DC bus bar 306, negative terminals 262 are coupled to negative DC bus bar 308, and neutral terminals 212 are coupled to neutral bus bar 309. Bus bars 306 and 308 are separated by a spacing 312 that exposes a portion of insulator 310. Phase leg modules 302 extend outward from bus bars 306 and 308. In some embodiments, positive DC bus bar 306 is coupled to positive rail 140 (shown in FIGS. 2, 3, 4, 5, and 6), negative DC bus bar 308 is coupled to negative rail 142 (shown in FIGS. 2, 3, 4, 5, and 6), and neutral bus bar 309 is coupled to neutral bus connection 156 (shown in FIGS. 2, 3, 4, 5, and 6). In some other embodiments, positive DC bus bar 306 is a portion of positive rail 140, and negative DC bus bar 308 is a portion of negative rail 142, and neutral bus bar 309 is a portion of neutral bus connection 156.

Figure 10:
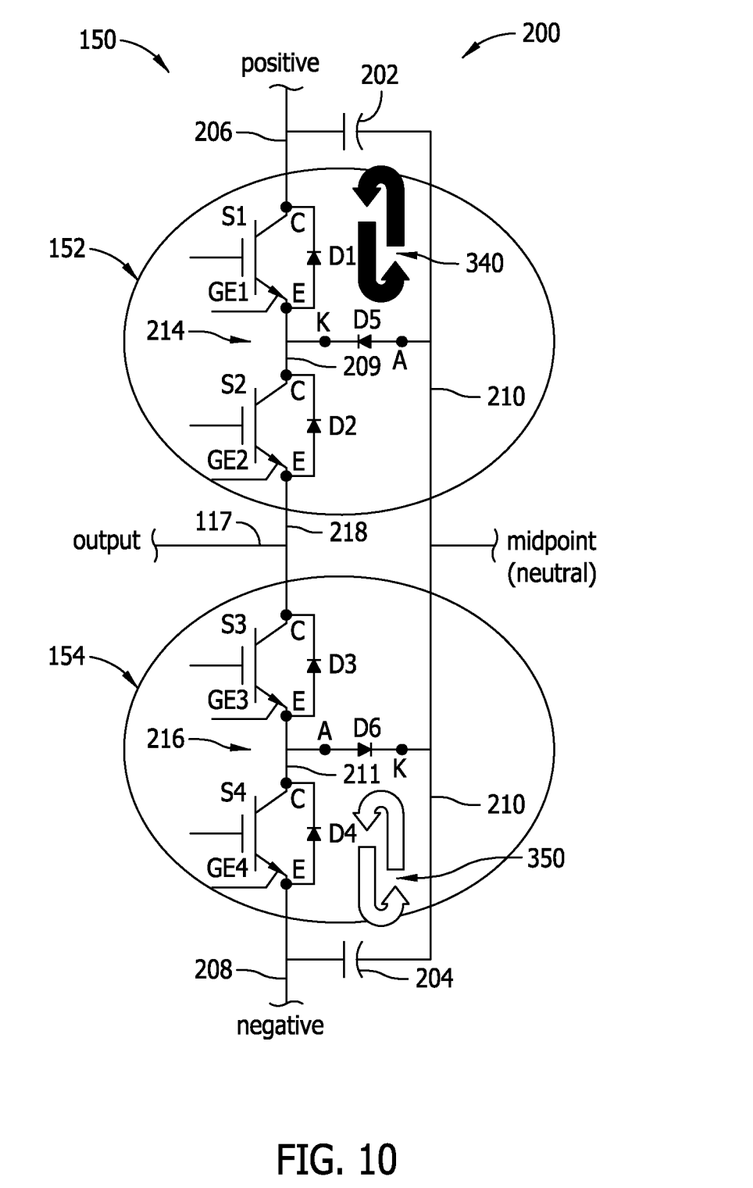
FIG. 10 is a schematic view of a plurality of exemplary small commutating loops in the three-level phase leg circuit shown in FIG. 4.

DC link assembly 300 facilitates use of a two-layer DC bus structure with three-level circuit NPC phase legs. Specifically, the simple two-layer DC link bus structure of DC link assembly 300 with interweaving positive and negative DC busses 306 and 308, respectively, with wrap-around configurations for phase leg modules 302 facilitates use of a three-level NPC structure in a device having a two-layer positive-neutral pair and negative-neutral pair. Also, the simple geometry of DC link assembly 300 facilitates decreased reliance on complex metal forming materials and techniques and the use of a single layer of dielectric between the two physical layers. Further, the simple two-layer DC link bus structure FIG. 10 is a schematic view of a plurality of exemplary first and second small commutating loops 340 and 350, respectively, in three-level phase leg circuit 200. First small commutating loop 340 is formed during a particular switching transition where outer switching device S1 is initially in an "off" state and inner switching device S2 is initially switched to an "on" state and switching device S1 is switched to an "on" state while switching device S2 remains in the "on" state. Clamping diode D5 is placed in reverse recovery and begins commutating such that current is transmitted through small commutating loop 340 defined by clamping diode D5, upper capacitor 202, and outer switching device switch S1.

Similarly, second small commutating loop 350 is formed during a particular switching transition where inner switching device S3 is initially in an "on" state and outer switching device S4 is initially in an "off" state and switching device S4 is switched to an "on" state while switching device S4 remains in the "on" state. Clamping diode D6 is placed in reverse recovery and begins commutating such that current is transmitted through small commutating loop 350 defined by clamping diode D6, lower capacitor 204, and outer switching device switch S4. First and second small commutating loops 340 and 350 are substantially symmetrical.

As described above, positive bus 206, negative bus 208, neutral bus 210, first switch interconnect bus 209, and second switch interconnect bus 211 are formed and oriented with a low inductance planar bus bar configuration that facilitates a low interconnect inductance within three-level phase leg circuit 200. Also, portions of positive bus 206, negative bus 208, neutral bus 210, first switch interconnect bus 209, and second switch interconnect bus 211, are formed and oriented to be substantially parallel to at least one of each other, thereby further facilitating such low interconnect inductance. Therefore, the associated inductance of commutating loops 340 and 350 is decreased, wherein the inductances of commutation loops 340 and 350 are dominated by the internal inductances of the power semiconductor switching devices S1 and S4 and DC link capacitors 202 and 204. Also, configuring and orienting the electrically-conductive busses within three-level phase leg circuit 200 to facilitate flux cancellation in commutation loops 340 and 350 when current flows therethrough facilitates decreasing the energy stored in the loop currents induced in commutating loops 340 and 350 through routine switching actions.

Figure 11:
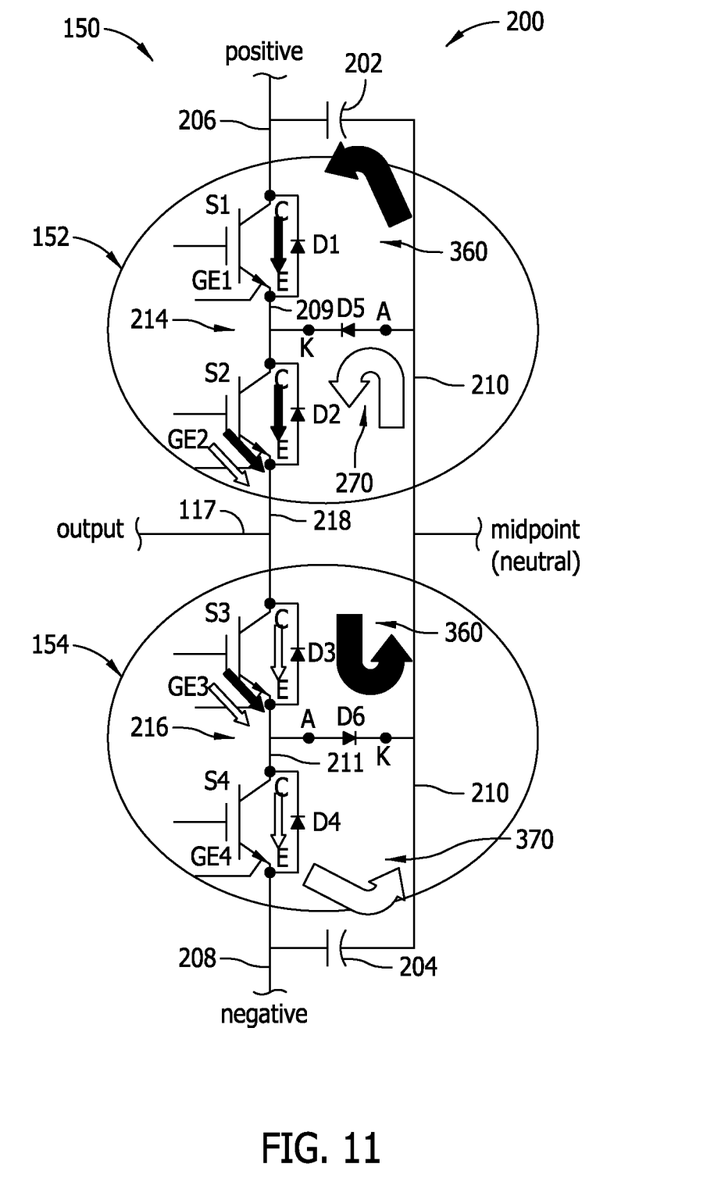
FIG. 11 is a schematic view of a plurality of exemplary large commutating loops in the three-level phase leg circuit shown in FIG. 4.

FIG. 11 is a schematic view of a plurality of exemplary first and second large commutating loops 360 and 370, respectively, in three-level phase leg circuit 200. First large commutating loop 360 is formed during a particular switching transition where inverse diodes D1 and D2 are initially conducting. Inner switching device S3 is switched to an "on" state. Inverse diodes D1 and D2 are placed in reverse recovery and begin commutating such that current is transmitted through large commutating loop 360 defined by clamping diode D6, upper capacitor 202, inverse diode D1, inverse diode D2, and inner switching device S3.

Similarly, second large commutating loop 370 is formed during a particular switching transition where inverse diodes D3 and D4 are initially transmitting. Inner switching device S2 is switched to an "on" state. Inverse diodes D3 and D4 are placed in reverse recovery and begin commutating such that current is transmitted through large commutating loop 370 defined by lower capacitor 204, clamping diode D5, inner switching device S2, inverse diode D3, and inverse diode D4. First and second large commutating loops 360 and 370 are substantially symmetrical.

As described above, positive bus 206, negative bus 208, neutral bus 210, first switch interconnect bus 209, second switch interconnect bus 211, and output conduit connection portion 218, are formed and oriented with a low inductance planar bus bar configuration that facilitate a low interconnect inductance within three-level phase leg circuit 200. Also, portions of positive bus 206, negative bus 208, neutral bus 210, first switch interconnect bus 209, second switch interconnect bus 211, and output conduit connection portion 218 are formed and oriented to be substantially parallel to at least one of each other, thereby further facilitating such low interconnect inductance. Therefore, the associated inductance of commutating loops 360 and 370 is decreased, wherein the inductances of commutation loops 360 and 370 are dominated by the internal inductances of the power semiconductor switching devices S1 through S4 and DC link capacitors 202 and 204. Also, configuring and orienting the electrically-conductive busses within three-level phase leg circuit 200 to facilitate flux cancellation in commutation loops 360 and 370 when current flows therethrough facilitates decreasing the energy stored in the loop currents induced in commutating loops 360 and 370 through routine switching actions.

The above-described embodiments facilitate efficient and cost-effective operation of electric power generation assets, including renewable electric power generation facilities such as wind turbine generators and a solar arrays, and non-renewable electric power generation facilities such as fossil fuel and nuclear power plants. The above-described embodiments also facilitate efficient and cost-effective operation of motor drive devices. The electric power generation facilities and motor drive devices include a power converter that facilitates generating and transmitting increased electric power using power converters with a smaller physical footprint. More specifically, the power converter described herein uses a three-level bridge configuration, thereby facilitating an increase in the switching speed of the power converters for a given IGBT switching frequency. Such increase in switching speed is facilitated by decreasing the inductance of commutating loops typically defined in three-level bridge configurations, thereby facilitating flux cancellation in the commutation loop when current flows therethrough, thereby facilitating a reduction of energy stored within loop currents induced therein through routine switching actions. Also, the output voltage of the power converter is increased and the power quality is improved by reducing the harmonics for similar switching speeds.

Exemplary embodiments of power converters are described above in detail. The power converters are not limited to the specific embodiments described herein, but rather, components of the power converters may be utilized independently and separately from other components and/or steps described herein. For example, the power converters may also be used in combination with other industrial power conversion systems and electric power generation systems, and are not limited to practice with only the renewable electric power generation facilities as described herein. Rather, the exemplary embodiment can be implemented and utilized in connection with many other system and facility applications.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A phase leg for a three-level power converter, said phase leg comprising:
   a heat sink device comprising a first surface and a second surface opposite said first surface;
   a first portion comprising at least one first semiconductor switching device coupled to said first surface;
   a first non-neutral planar bus bar coupled to said first semiconductor switching device;
   a second portion comprising at least one second semiconductor switching device coupled to said second surface; and
   a second non-neutral planar bus bar coupled to said second semiconductor switching device.

2. The phase leg in accordance with claim 1, wherein said heat sink device is fluid-cooled.

3. The phase leg in accordance with claim 1, further comprising a positive bus connection coupled to said first non-neutral planar bus bar and a negative bus connection coupled to said second non-neutral planar bus bar, wherein said positive bus connection is positioned adjacent to said first portion, said negative bus connection is positioned adjacent to said second portion, and said positive bus connection is adjacent said negative bus connection.

4. The phase leg in accordance with claim 1, further comprising at least a portion of a third non-neutral planar bus bar coupled to and extending between said first portion and said second portion.

5. The phase leg in accordance with claim 4, further comprising a neutral planar bus bar extending over said first, second, and third non-neutral planar bus bars.

6. The phase leg in accordance with claim 5, further comprising an insulator positioned between said neutral planar bus bar and said first, second, and third non-neutral planar bus bars.

7. The phase leg in accordance with claim 6, wherein said first, second, and third non-neutral planar bus bars, said neutral planar bus bar, and said insulator are wrapped around said heat sink device, thereby extending over said first surface and said second surface.

8. A phase leg for a three-level power converter, said phase leg comprising:
   a plurality of non-neutral planar bus bars;
   a plurality of semiconductor switching devices coupled to at least one of said non-neutral planar bus bars; and,
   a neutral planar bus bar,
   wherein, said non-neutral planar bus bars, said semiconductor switching devices, and said neutral planar bus bar are configured to define at least one commutation loop within said phase leg, said non-neutral planar bus bars and said neutral planar bus bar configured and oriented to facilitate flux cancellation in said commutation loop when current flows therethrough, thereby facilitating a reduction of energy stored within loop currents induced therein.

9. The phase leg in accordance with claim 8, wherein said neutral planar bus bar extends over said plurality of non-neutral planar bus bars.

10. The phase leg in accordance with claim 9, further comprising an insulator positioned between said neutral planar bus bar and said plurality of non-neutral planar bus bars.

11. The phase leg in accordance with claim 8, further comprising a positive bus connection coupled to a first non-neutral planar bus bar and a negative bus connection coupled to a second non-neutral planar bus bar.

12. The phase leg in accordance with claim 8, wherein said commutating loop comprises a first pair of commutating loops and a second pair of commutating loops, wherein each of said commutating loops of said first pair of commutating loops is substantially symmetrical to each other, and each of said commutating loops of said second pair of commutating loops is substantially symmetrical to each other.

13. The phase leg in accordance with claim 12, wherein each of said commutating loops comprises a series circuit comprising at least one diode, at least one semiconductor switching device, at least one capacitive device, at least one of said non-neutral planar bus bars, and said neutral planar bus bar.

14. The phase leg in accordance with claim 8, further comprising:
   at least one clamping diode;
   a non-neutral planar bus bar extension coupled to said non-neutral planar bus bar and said clamping diode; and, a neutral planar bus bar extension coupled to said neutral planar bus bar and said clamping diode.

15. A two-layer, direct current (DC) link assembly for a three-level power converter comprising:
- a first layer comprising a positive planar bus bar and an adjacent negative planar bus bar separated with a spacing therebetween;
- a second layer comprising a neutral planar bus bar sized to substantially similar dimensions as said first layer;
- an insulator positioned between said first layer and said second layer, wherein said insulator is sized to completely extend over said second layer; and,
- at least one phase leg module coupled to said first layer and said second layer.

16. The DC link assembly in accordance with claim 15, wherein said phase leg module comprises:
- a heat sink device comprising a first surface and a second surface opposite said first surface;
- a first portion comprising at least one first semiconductor switching device coupled to said first surface; and,
- a second portion comprising at least one second semiconductor switching device coupled to said second surface.

17. The DC link assembly in accordance with claim 16, wherein said phase leg module further comprises:
- a first non-neutral planar bus bar coupled to said first portion;
- a second non-neutral planar bus bar coupled to said second; and,
- a neutral planar bus bar extending over said first and second non-neutral planar bus bars.

18. The DC link assembly in accordance with claim 17, further comprising:
- a positive bus connection coupled to said first non-neutral planar bus bar and said positive planar bus bar; and,
- a negative bus connection coupled to said second non-neutral planar bus bar and said negative planar bus bar, wherein said positive bus connection is positioned adjacent to said first portion, said negative bus connection is positioned adjacent to said second portion, and said positive bus connection is adjacent said negative bus connection.

19. The DC link assembly in accordance with claim 15, further comprising a plurality of capacitor modules coupled to said first layer and said second layer.

* * * * *